(12) United States Patent
Reasoner et al.

(10) Patent No.: US 6,483,710 B1
(45) Date of Patent: Nov. 19, 2002

(54) METHOD AND APPARATUS TO FACILITATE REMOVAL AND INSTALLATION OF REMOVABLE COMPONENTS

(75) Inventors: Kelly J. Reasoner, Ft. Collins, CO (US); Robert L. Mueller, Windsor, CO (US); Gregg S. Schmidtke, Ft. Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 36 days.

(21) Appl. No.: 09/862,359

(22) Filed: May 22, 2001

(51) Int. Cl.$^7$ ................................................ H05K 5/00
(52) U.S. Cl. .................... 361/726; 439/157; 312/332.1; 29/830
(58) Field of Search ................................ 361/726, 724, 361/725, 685; 439/157–160, 248; 312/223.1, 223.2, 332.1, 333; 29/830, 832; 360/97.01, 98.01

(56) References Cited

U.S. PATENT DOCUMENTS

| | | | |
|---|---|---|---|
| 5,325,263 A | 6/1994 | Singer et al. | 361/683 |
| 5,909,935 A | 6/1999 | Esperandieu et al. | 312/333 |
| 6,178,086 B1 | 1/2001 | Sim et al. | 361/683 |
| 6,238,026 B1 * | 5/2001 | Adams et al. | 312/223.2 |
| 6,257,682 B1 * | 7/2001 | Liu et al. | 312/223.2 |
| 6,318,679 B1 * | 11/2001 | Yang et al. | 361/605 |

* cited by examiner

*Primary Examiner*—Darren Schuberg
*Assistant Examiner*—Hung Van Duong

(57) ABSTRACT

A method and apparatus for facilitating the removal and installation of components of a system. The installation and removal of the component may be a completed without the need to manually disconnect connectors, use tools, take a lengthy amount of time, or interrupt a SCSI loop. A latch assembly is utilized to control connecting and locking conditions of the component.

20 Claims, 12 Drawing Sheets

METHOD AND APPARATUS TO FACILITATE REMOVAL AND INSTALLATION OF REMOVABLE COMPONENTS

FIELD OF THE INVENTION

The present invention relates generally to removable electronic components that may need to be upgraded, repaired, or replaced.

BACKGROUND OF THE INVENTION

Components of systems are routinely removed for a number of reasons. Some examples of these reasons include: system upgrades, component repair, maintenance, etc. Typically, components are wired internally and/or externally to interface with the system to which they are installed. This wiring may be made temporary by utilizing connectors, for example: standard power connectors, PCI connectors, ribbon cable, or screw terminals, etc.

Some components have connectors on the front side of the component so they may be "automatically" connected as a result of an installation process. Such automatic connections have been utilized, for example, in Personal Computer Memory Card International Association (PCMIA) cards, removable drives on computers, handheld type computing devices, automotive stereos, computer docking stations, and the like. Additionally, connectors have been located on the backside of components as external wiring, whereby the wiring is manually removed from the outside of the system prior to removing the components.

The installation and removal of conventional components often requires tools. For example, conventional screws are often used to hold components. The installation and removal of components typically includes the manual connection of electrical connectors. These electrical connectors of a variety of types often require small screws to be tightened to assure a proper connection. These screws and their accompanying washers are often loose, resulting in excessive time searching for a dropped screw or paying particular attention to retain the loose connectors and fasteners.

One particular example of a system having removable components is a media autochanger system. An example of a media autochanger system 900 is illustrated in FIG. 1. The media autochanger system 900 may be provided with a front panel 950, a host computer 952 and network connection 954.

The media autochanger system 900 provides a safe, permanent way to archive huge amounts of information and keep the information immediately accessible. The media autochanger system 900 is a high-speed alternative to paper-based, tape-based or microfiche-based storage. Additionally, the media autochanger system 900 may be upgraded, for example, in the form of storage capacity, number of drives or number of cartridge slots as needed. This adaptability allows a user to purchase a system that meets current needs and then increase performance or capacity as required at a later time.

The media autochanger system 900 may be provided with one or more conventional housings. One such conventional housing 904 is illustrated in FIG. 2. Referring to FIG. 2, the conventional housing 904 may receive one or more removable components such as a drive module 920. The conventional housing 904 may have one drive module 920 in a two-drive bay 908. A Small Computer Systems Interface "SCSI" connector 906 may be provided with the conventional device. The SCSI connector 906 is used for data transfer to and from the drive module 920. The SCSI connector 906 may be located on a backside 910 of the drive module 920 via a mounting plate 930. The mounting plate 930 may be attached to drive module 920 by two screws 940, 941 having washers.

A ribbon cable (not shown) on the inside of the mounting plate 930 is provided in a loop circuit. The ribbon cable may be provided with a terminal portion (not shown) to electrically connect the SCSI connector 906 to the internal components of the drive module 920. The terminal portion allows the ribbon cable to be disconnected from the drive module 920 without breaking the SCSI loop. By maintaining the SCSI loop, devices attached down-line remain "on-line". If the SCSI loop is broken, the resulting glitch in the SCSI Bus may interrupt backup of data. If data is interrupted, the entire backup process may need to be reinitiated. Restarting a backup operation results in loss of time, uncertainty of data integrity and potential complete loss of data. Additionally, the terminal portion is typically provided having a relatively short length and order to minimize reflections in data traveling in the ribbon cable. An American National Standards Institute (ANSI) specification T10 titled INFTECH-SCSI PARALLEL INT-2-SPI2 imposes a required maximum length for the terminal portion of 100 mm in order to preserve the quality of the data.

To remove the drive module 920 from the housing 904, the media autochanger system 900, FIG. 1, may be notified of the intent to remove the drive module 920. This notification may generally occur in one of three ways: by notifying the host computer 952, notifying the front panel 950, or notifying through the network connection 954. After notifying the system, a power-down procedure is initiated for the drive module 920. During the power-down procedure a media tape may be rewound and ejected, a robot arm may be removed and power to the drive is terminated.

After the drive module 920 is powered-down (which may take several minutes), the mounting plate 930 may be removed to uncover an opening in the back 910 of the drive module 920 and provide access to the ribbon connector. Removal of the mounting plate 930 may require removal of the screws 940,941 with a screwdriver. The ribbon cable may be disconnected from the drive module 920 through the opening in the back 910 of the drive module 920. This removal of the ribbon cable requires a user to reach inside the drive module 920, and manually disconnect the terminal portion of the ribbon cable from the drive module 920. After the ribbon cable has been disconnected, a top fastener 960 and a bottom fastener 962 may be removed to free the drive module 920 from the housing 904. The drive module 920 may then be slid out of the bay 908.

SUMMARY OF THE INVENTION

Disclosed herein is a method directed to a removable component of a system having at least one first connector operatively associated with the component. Additionally, the system may be provided with at least one second connector operatively associated with a housing. Wherein, the component has a connected condition in which the first connector may be electrically engaged with the second connector. The component may also have a disconnected condition in which the first connector may be electrically disengaged from the second connector. Additionally, the component may have at least a locked condition and an unlocked condition. Applying a force may cause the component to move from the connected condition to the disconnected condition.

The disclosure may be further directed to a system including a housing and a component removably received within the housing. The system may be provided with at least one first connector operatively associated with the component and at least one second connector operatively associated with the housing. The component may have at least a connected and a disconnected condition wherein, in the connected condition, the first connector may be electrically engaged with the second connector. Additionally, in the disconnected condition, the first connector may be electrically disengaged from the second connector. The component may have at least a locked condition and an unlocked condition, and moving the component from the connected to the disconnected condition causes the component to move from the locked to the unlocked condition.

Further disclosed herein may be a method directed to a removable component of a system having a first electrical connector on a housing and a second electrical connector on a component. The second electrical connector may be disconnected from the first electrical connector by moving the second electrical connector relative to the first electrical connector in a first direction. The component may be moved relative to the housing in a second direction; wherein, the first direction may be transverse to the second direction.

DETAILED DESCRIPTION OF THE INVENTION

Disclosed herein is a method and apparatus for facilitating the removal and installation of a component of a system. The installation and removal of the component may be completed without the need to manually connect or disconnect connectors or use tools. Further, installation and removal may be accomplished quickly without interrupting a SCSI loop.

Figure 3:
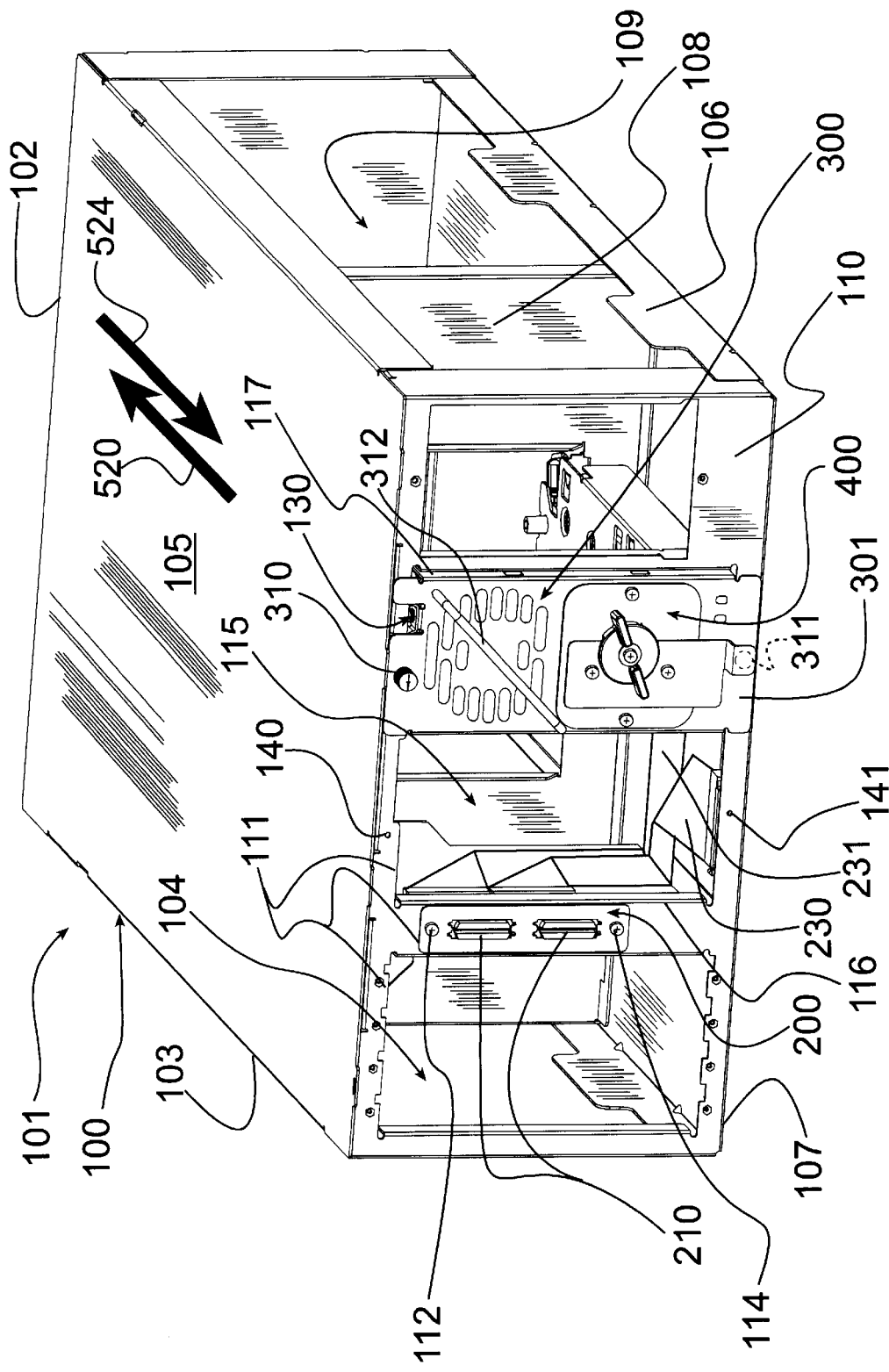
FIG. 3 is a perspective view of a housing of a media autochanger system.

Although the method and apparatus may be used in conjunction with a wide variety of systems, the description presented herein is directed to a media autochanger system 101, FIG. 3 for exemplary purposes.

Figure 1:
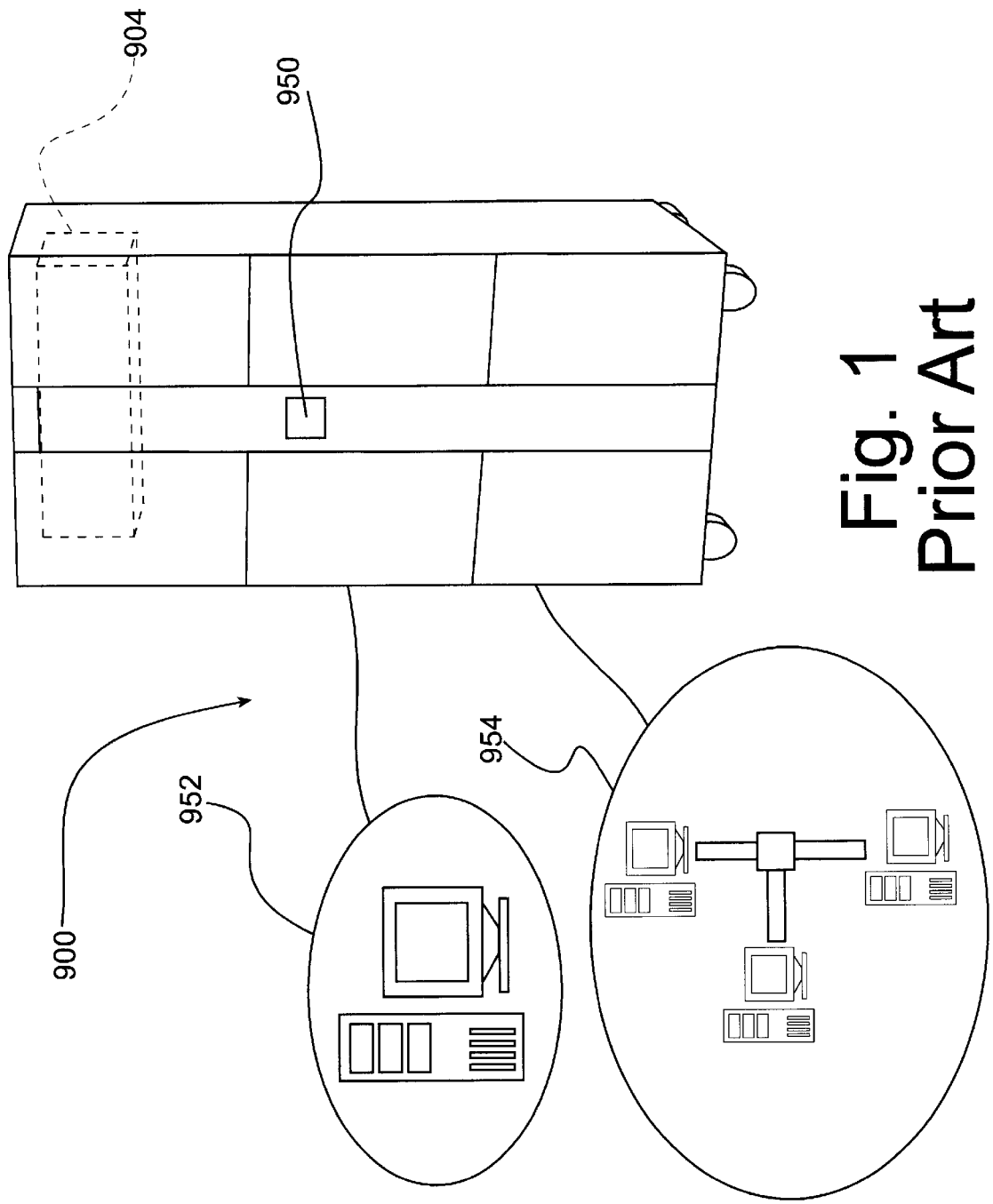
FIG. 1 is a front perspective view of a conventional media autochanger system.
Figure 2:
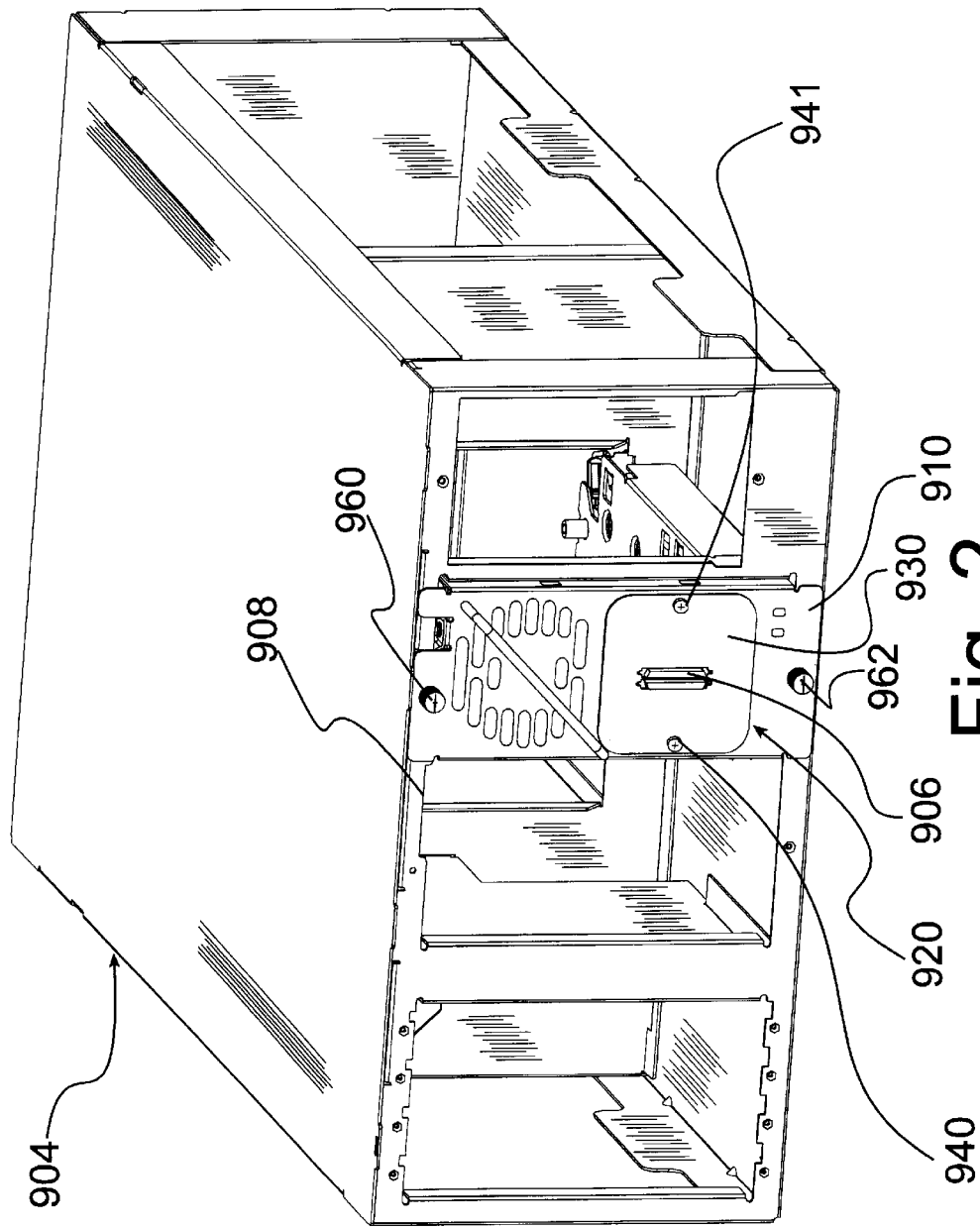
FIG. 2 is a perspective view of a backside of a conventional housing.

Referring to FIG. 3, the media autochanger system 101 may be similar to the media autochanger system 900, FIG. 1, of the prior art. The media autochanger system 101 may be provided with a housing 100. The housing 100 may be similar to the prior art housing 904. A major difference between the housing 100 and the prior art housing 904 is the formers' adaptation to receive a removable component as will now be described.

Referring to FIG. 3, the housing 100 may be provided with a front portion 102, a back portion 110, a top portion 105, a left portion 103, a right portion 106 and a bottom portion 107. The front portion 102, the back portion 110, the left portion 103, the right portion 106 and the bottom portion 107 define an internal cavity 109. In an exemplary embodiment, the housing 100 may, for example, be manufactured by formed sheet metal.

The back portion 110 may have one or more threaded holes (e.g. 140, 141) for receiving fasteners (e.g. 310, 311). The back portion 110 may also be provided with one or more openings 111.

The housing 100 may be provided with structural elements 108 within the internal cavity 109. These structural elements 108 may provide structural integrity and mounting locations for various components.

The structural elements 108 and the openings 111 may be positioned to create one or more individual bays 104, 115. Bay 115 may be provided with a left side portion 116 and a right side portion 117.

The housing 100 may be provided with a connector assembly 200. The connector assembly 200 may be attached to the housing 100 at one of the openings 111. The connector assembly 200 may be attached to the housing 100 on the back portion 110 by fasteners 112, 114. The connector assembly 200 may be provided with connectors 210. The connectors 210 may, for example, be of the type commercially available under the description "Receptacle Assembly, 68 Position Stacked Right Angle" distributed by Tyco Electronics Corporation of Harrisburg, Pa.

Figure 4:
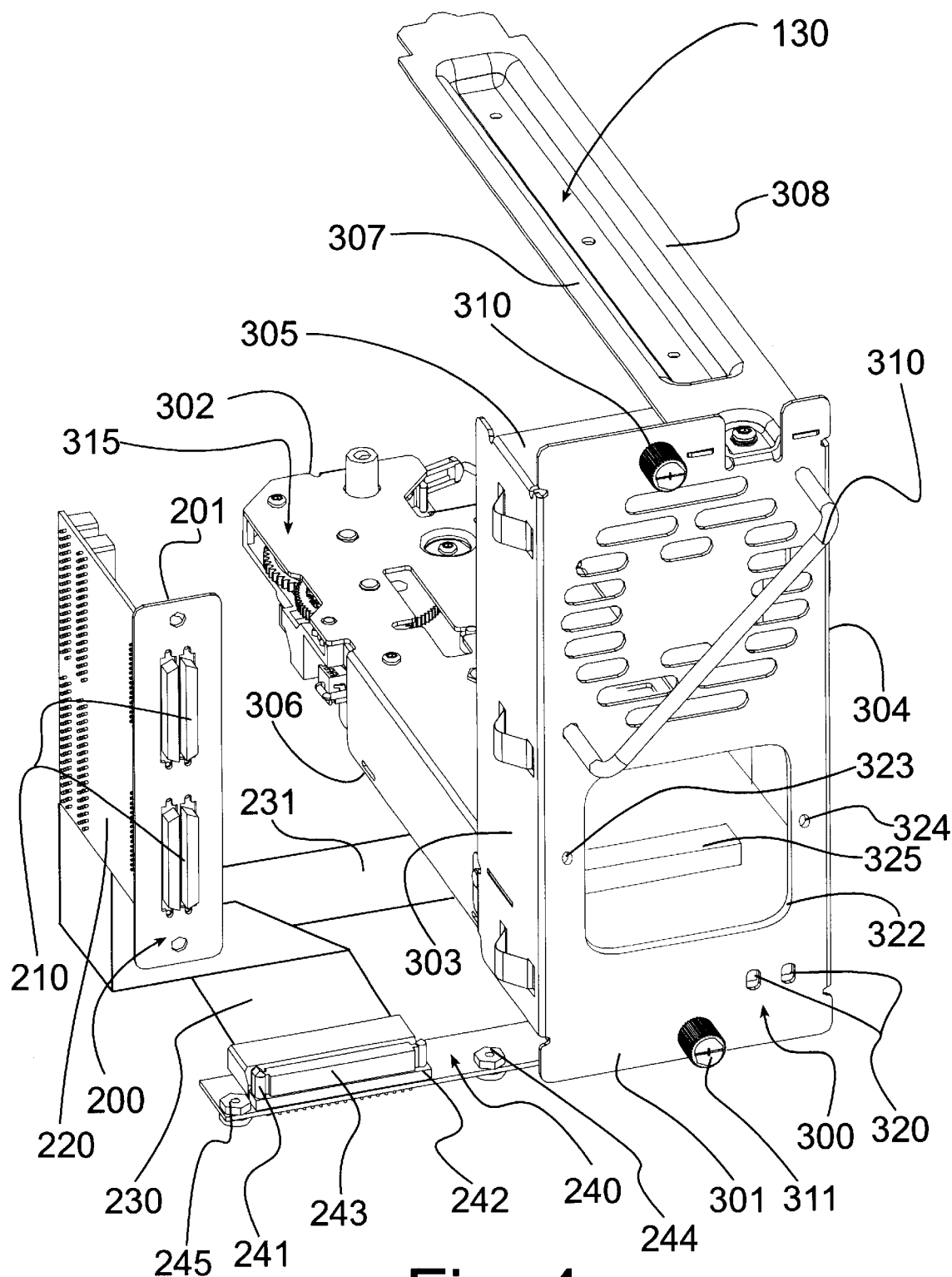
FIG. 4 is a perspective view of elements of a drive module.

Referring to FIG. 4, the connector assembly 200 may be provided with a back portion 201. The back portion 201 may be provided with a connector board 220. The connector board 220 may receive drive loop cables 230, 231. The drive loop cables 230, 231 may be connected to a housing board 240. Although not shown in any of the drawings, the drive loop cable 231 may be connected to the housing board 240.

With further reference to FIG. 4, the housing board 240 may be attached to the bottom portion 107, FIG. 3, of the housing 100 by fasteners 244, 245. Referring now to FIG. 3, the positioning of the housing board 240 may be between the left portion 116 and the right portion 117 of the bay 115 near the back portion 110 of the housing 100.

Referring to FIG. 3, the housing 101 in the illustrated configuration may receive two drive modules. A first drive module 300 may be received in the right side portion 117 of the bay 115. The second drive module (not shown) may be received in the left side portion 116 of the bay 115. For illustrative purposes, the wiring for the empty, left side portion 116 of the bay 115 will now be described, it being understood that the description of the wiring of the left side portion 116 may be substantially similar to the right side portion 117.

Referring to FIG. 4, the drive loop cable 230 may be routed within the housing 100 to electrically connect the connector board 220 to the housing board 240. The housing board 240 may be provided with a SCSI connector 243. The SCSI connector 243 may be provided with alignment pins 241, 242. The SCSI connector 243 of the exemplary embodiment may, for example, be of the type commercially available from Molex Incorporated of Lisle, Ill. under the model number 71661-2568.

Referring to FIG. 4, the drive module 300 may have a back portion 301, a front portion 302, a left portion 303, a right portion 304, a top portion 305 and a bottom portion 306. A rail system 130 may be provided on the top portion 305. The rail system 130 may be provided with a left tab 307 and a right tab 308.

The back portion 301 of the drive module 300 may be provided with an opening 322. Near the perimeter of the opening 322, a left threaded mounting hole 323 and a right threaded mounting hole 324 may be provided. Additionally, a handle 312 may be provided on the back portion 301 of the drive module 300. Fasteners 310, 311 may be provided on the back portion 301. In the exemplary embodiment, the fasteners 310, 311 may, for example, be of the spring, thumbscrew-type.

Also shown in FIG. 4, indicator lights 320 may be provided on the back portion 301 of the drive module 300. The drive module 300 may be provided with various electomechanical sub-systems for reading and writing data. For illustration purposes, most of the electromechanical subsystems have been removed as shown in FIG. 4. One example of a sub-system as shown is a gear assembly 315. The gear assembly 315 is described in patent application Ser. No. 09/657,335 of Coffin et al. for a SPL1T COMPACT GEAR ASSEMBLY FOR A DRIVE LOADER filed on Sep. 7, 2000; which is hereby specifically incorporated by reference for all that is disclosed therein. The drive module 300 may also be provided with a drive board connector 325. The drive board connector 325 may be accessed through the opening 322.

Figure 5:
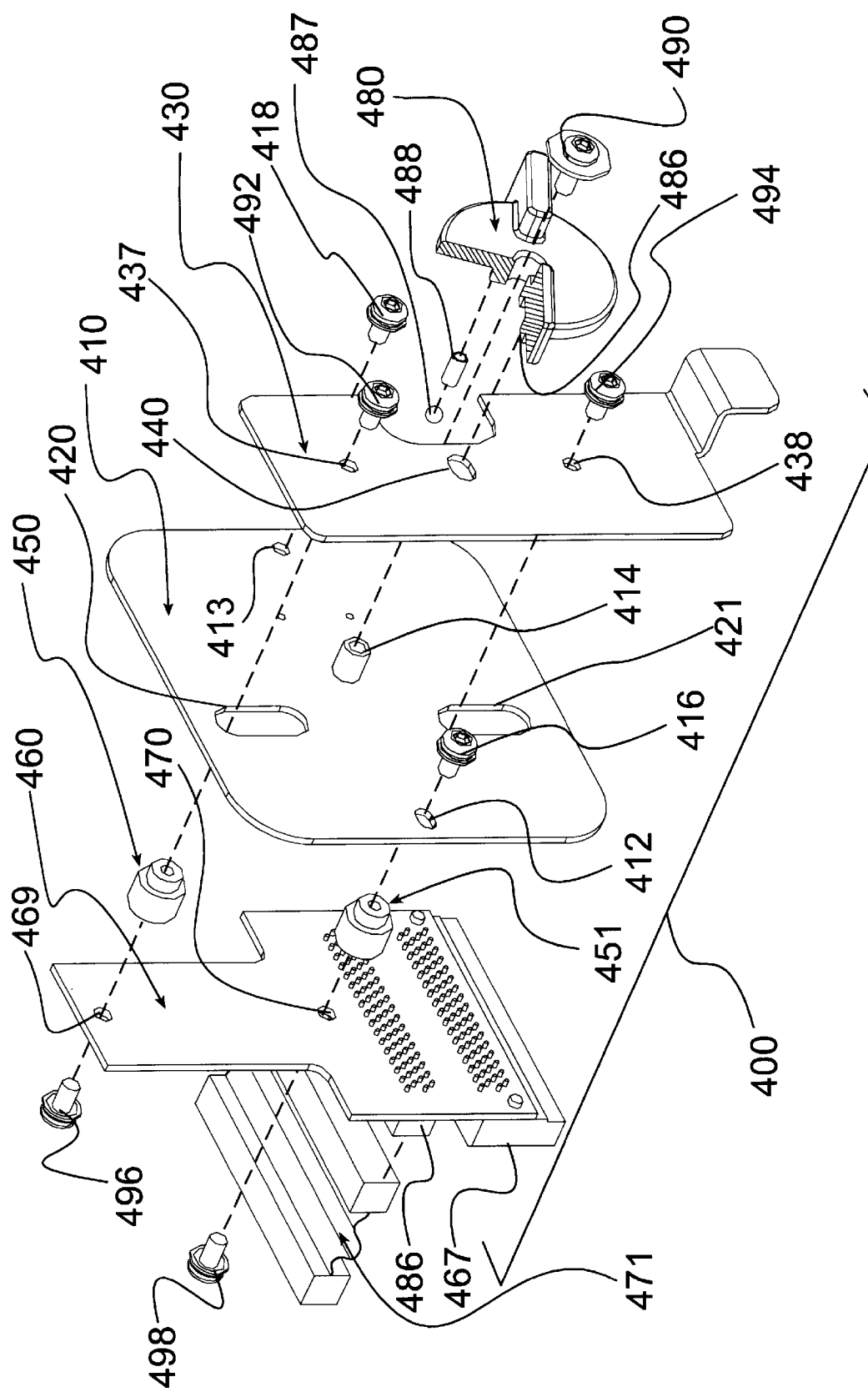
FIG. 5 is an exploded view of a latch assembly.
Figure 6:
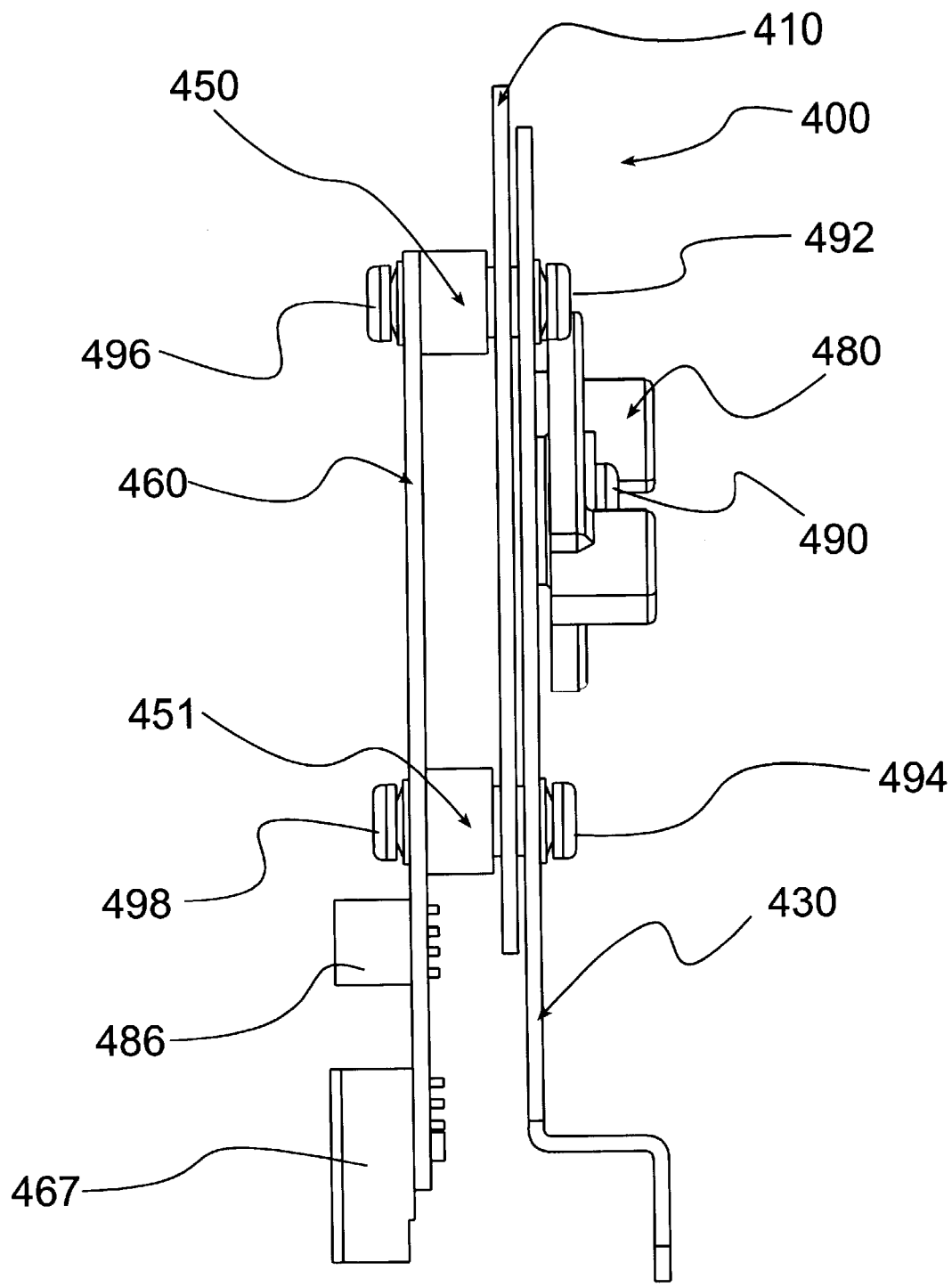
FIG. 6 is a side view of the latch assembly of FIG. 5.

FIGS. 5 and 6 illustrate a latch assembly 400. Latch assembly 400 may be provided with a mounting plate 410, a capture plate 430, a top spacer 450, a bottom spacer 451, a SCSI board 460, an actuator 480 and a ribbon cable 471 (FIG. 5). The mounting plate for 410 may serve as the central attachment point to which the other components are directly or indirectly attached.

Figure 7:
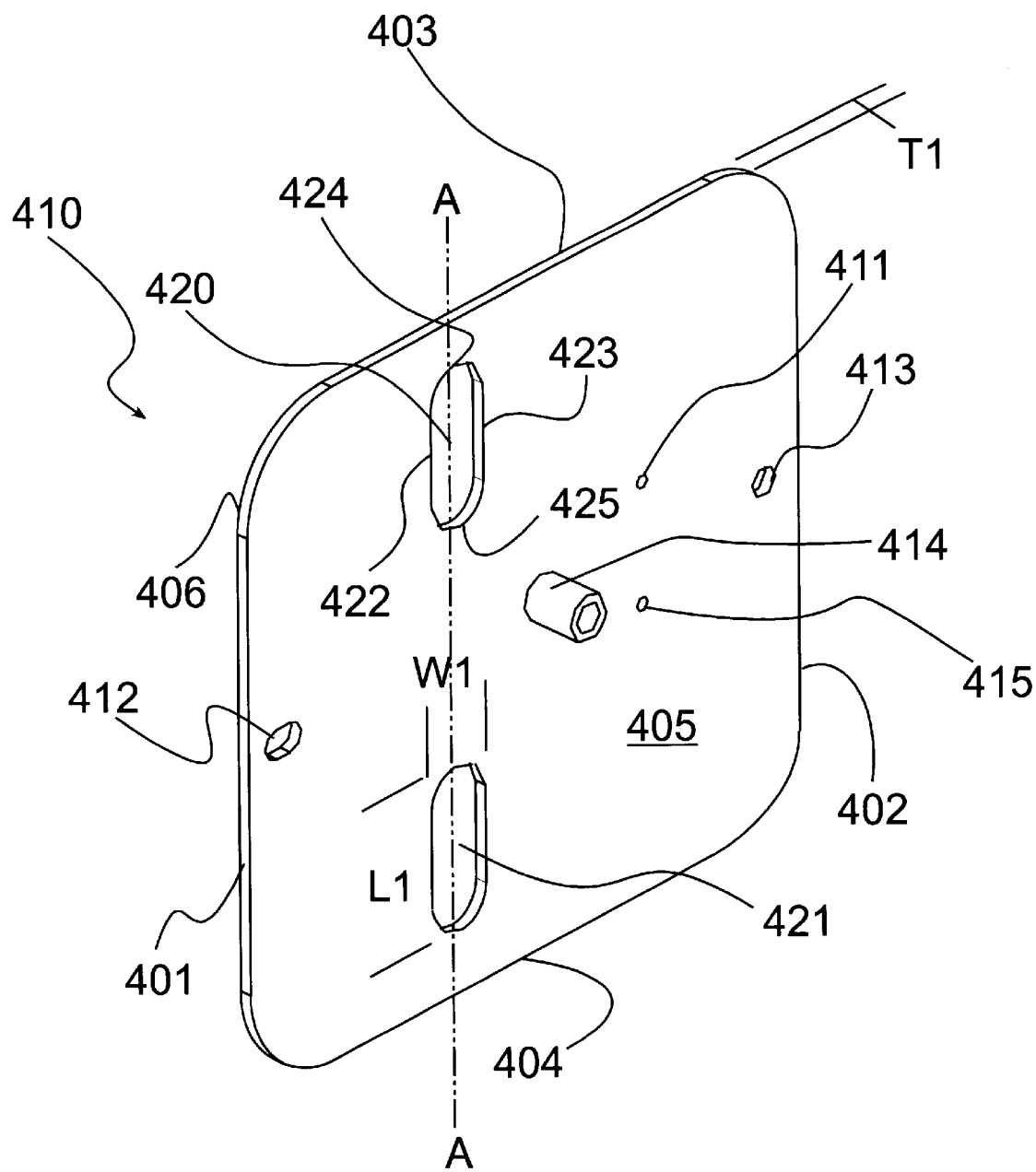
FIG. 7 is a perspective view of a mounting plate of the latch assembly of FIG. 5.

Referring to FIG. 7, the mounting plate 410 may be provided with a left side portion 401, a right side portion 402, a top portion 403, a bottom portion 404, a front face portion 405 and a back face portion 406. The mounting plate 410 may also be provided with a top vertical slot 420, a bottom vertical slot 421, a pair of detent holes 411, 415, a first attachment hole 412, a second attachment hole 413 and a threaded actuator post 414.

Referring to FIG. 7, the bottom vertical slot 421 may be substantially similar to the top vertical slot 420. The top vertical slot 420 will be described in detail, it being understood that the bottom vertical slot 421 may have the same details as the top vertical slot 420. The top vertical slot 420 may have a left side portion 422, a right side portion 423, a top portion 424 and a bottom portion 425. The length "L1" and width "W1" of both vertical slots 420, 421 are shown corresponding to the bottom vertical slot 421 for clarity purposes. In the exemplary embodiment, the dimensions may, for example, be about 11.5 mm for "L1" and about 7.85 mm for "W1". These actual dimensions are considered to be a design alternative and could be scaled to larger or smaller values based on the particular design.

Additionally, the left side portion 422 and right side portion 423 may be relatively parallel to a line AA, FIG. 7. The line M may be parallel to the left and right side portions 401, 402 of the mounting plate 410. The mounting plate 410 may have a thickness of "T1". In the exemplary embodiment, the dimension may, for example, be about 1.4 mm for "T1". The first and second attachment holes 412, 413 may be positioned at any location near the perimeter of the mounting plate 410. The attachment holes 412, 413 may be provided to receive a first fastener 416 and a second fastener 418 (FIG. 5).

Figure 8:
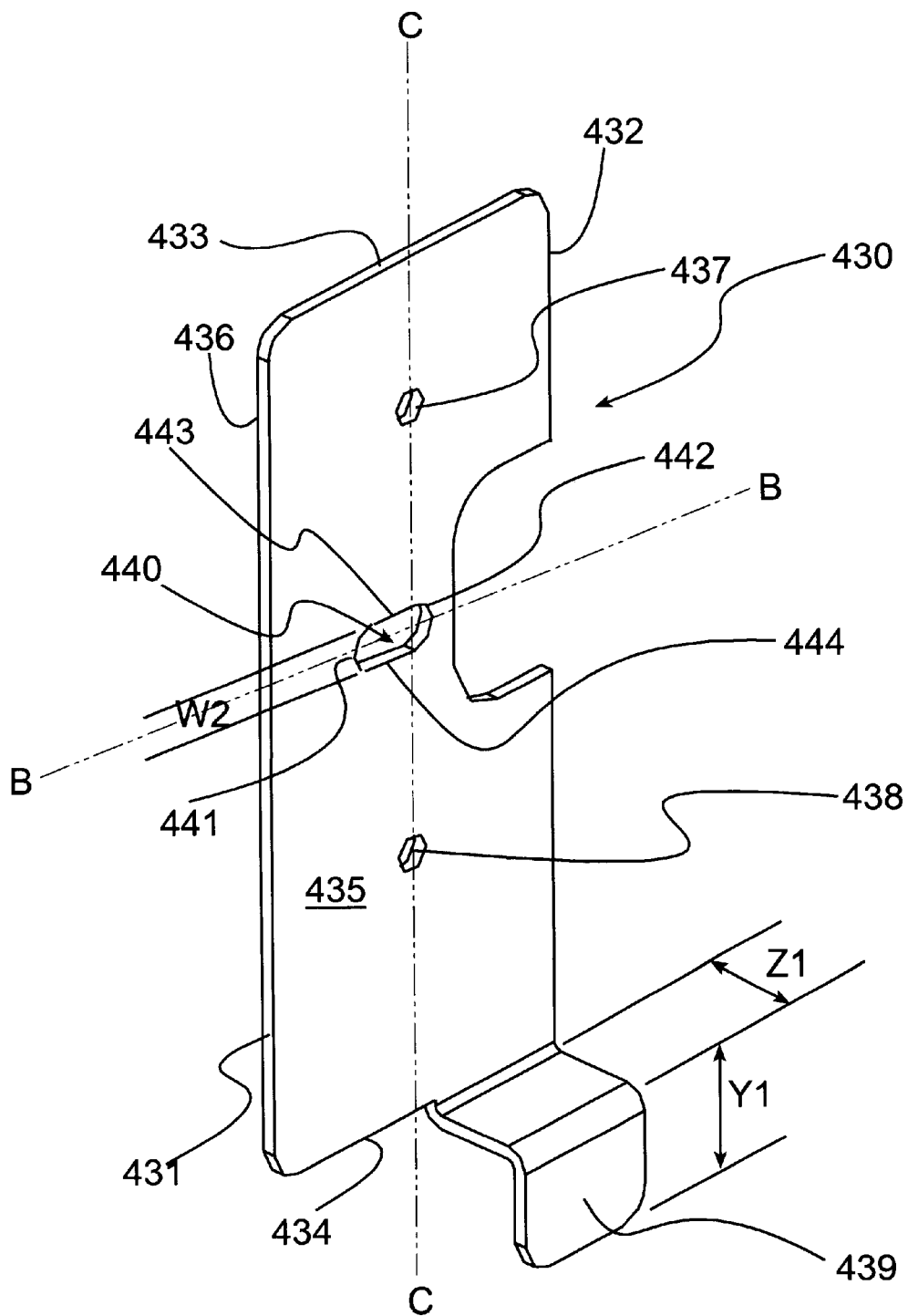
FIG. 8 is a perspective view of a capture plate of the latch assembly of FIG. 5.

Referring again to FIGS. 5 and 6, latch assembly 400 may also be provided with a capture plate 430. Referring to FIG. 8, the capture plate 430 may be provided with a left side portion 431, a right side portion 432, a top portion 433, a bottom portion 434, a front face portion 435 and a back face portion 436. The capture plate 430 may also be provided with a top fastener hole 437, a bottom fastener hole 438, a fastener cover 439 and a horizontal slot 440.

Referring to FIG. 8, the horizontal slot 440 may have a left side portion 441, a right side portion 442, a top portion 443, and a bottom portion 444. The top portion 443 and bottom portion 444 of the horizontal slot 440 may be relatively parallel to a line BB. A line CC may be provided that extends between the centers of the top fastener hole 437 and the bottom fastener hole 438. The line BB may be relatively perpendicular to the line CC. In the exemplary embodiment, the angle between BB and CC may, for example, be about 90 degrees.

The horizontal slot 440 of the capture plate 430 may have a slot width of "W2". In the exemplary embodiment, the dimension may, for example, be about 4.76 mm for "W2". These actual dimensions are considered to be a design alternative and could be scaled to larger or smaller values based on the particular design.

As shown in FIG. 8, the fastener cover 439 may be a simple fold feature that rises above the front face portion 435 of the capture plate 430 by a dimension "Z1". The fastener cover 439 may also extend below the bottom portion 434 by a dimension "Y1". In the exemplary embodiment the dimensions may be, for example, about 11.35 mm for "Z1" and about 11.77 mm for "Y1". These actual dimensions are considered to be a design alternative and could be scaled to larger or smaller values based on the particular design.

Referring to FIGS. 5 and 6, the latch assembly 400 may be provided with a top board spacer 450 and a bottom board spacer 451. The top board spacer 450 may be substantially similar to the bottom board spacer 451. The top board spacer 450 will be described in detail, it being understood that this description may apply equally to the bottom board spacer 450.

Figure 9:
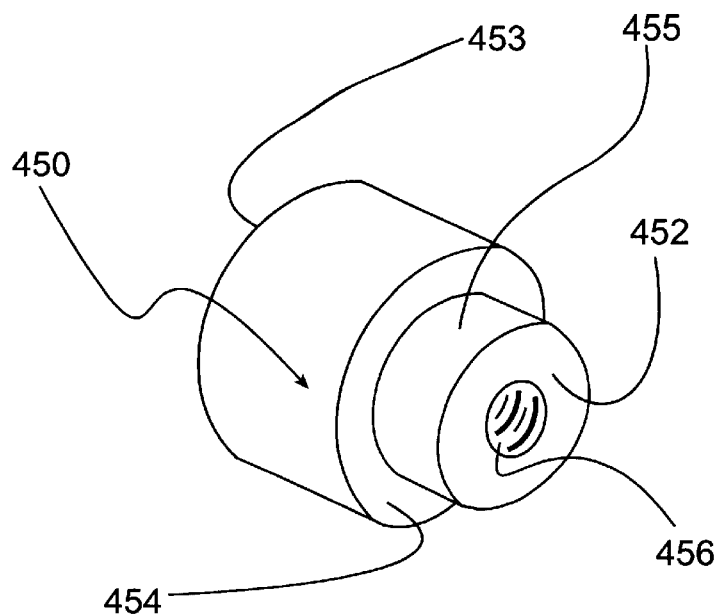
FIG. 9 is a perspective view of a board spacer of the latch assembly of FIG. 5.
Figure 10:
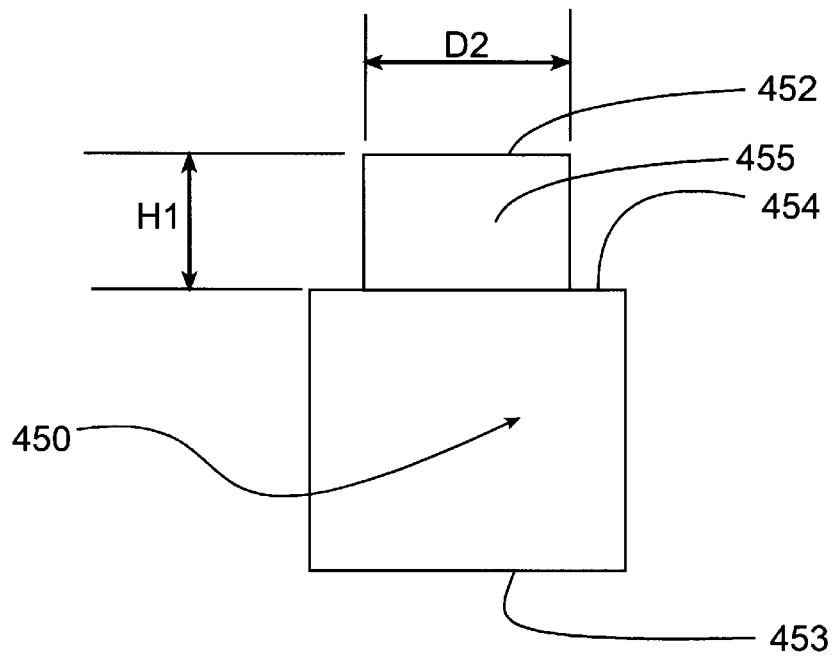
FIG. 10 is a side view of the board spacer of FIG. 9.

Referring to FIGS. 9 and 10, the top board spacer 450 may be provided with a front face 452, a back face 453, a spacer shoulder portion 454, a spacer neck portion 455 and a threaded hole 456. The spacer neck portion 455 may have a height of "H1", FIG. 10, which may be greater then the thickness "T1", FIG. 7, of the mounting plate 410. Referring again to FIG. 9, the spacer neck portion 455 may have a diameter "D2", FIG. 10, that is less then the width "W1", FIG. 7, of the vertical slots 420, 421 of the mounting plate 410. Referring to FIG. 9, the threaded hole 456 may extend through the entire board spacer 450. In the exemplary embodiment shown in FIG. 10, the dimensions may, for example, be about 2.897 mm for "H1" and about 6.35 mm for "D2". These actual dimensions are considered to be a design alternative and could be scaled to larger or smaller values based on the particular design.

Figure 11:
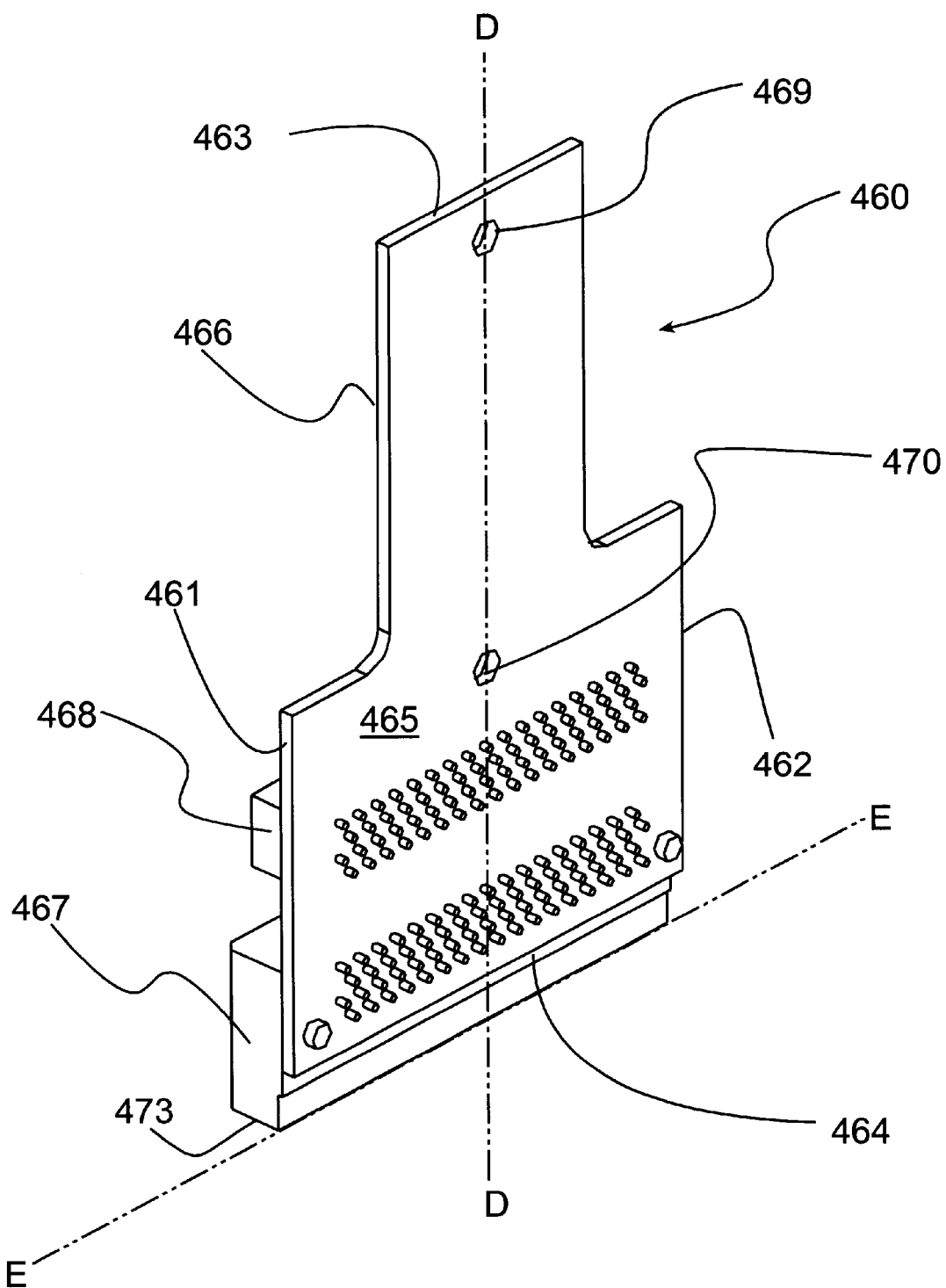
FIG. 11 is a perspective view of a SCSI board of the latch assembly of FIG. 5.

Referring to FIG. 5, the latch assembly 400 may be provided with a SCSI board 460. Referring now to FIG. 11, the SCSI board 460 may be provided having a left side portion 461, a right side portion 462, a top portion 463, a bottom portion 464, a front face portion 465, a back face portion 466, a first connector 467, a second connector 468, a top fastener hole 469 and a bottom fastener hole 470. A line DD may be provided that extends between the centers of the top fastener hole 469 and the bottom fastener hole 470. A line EE may lie along a bottom end portion 473 of the first connector 467 and may be relatively perpendicular to the line DD. In the exemplary embodiment the angle between DD and EE may be, for example, about 90 degrees.

Referring to FIG. 11, the first connector 467 may be a SCSI-type connector provided with alignment holes (not shown) positioned on the bottom end portion 473. The first connector 467 in the exemplary embodiment may, for example, be of the type commercially available from Molex Incorporated of Lisle, Ill. under the model number 71660-7068.

Figure 12:
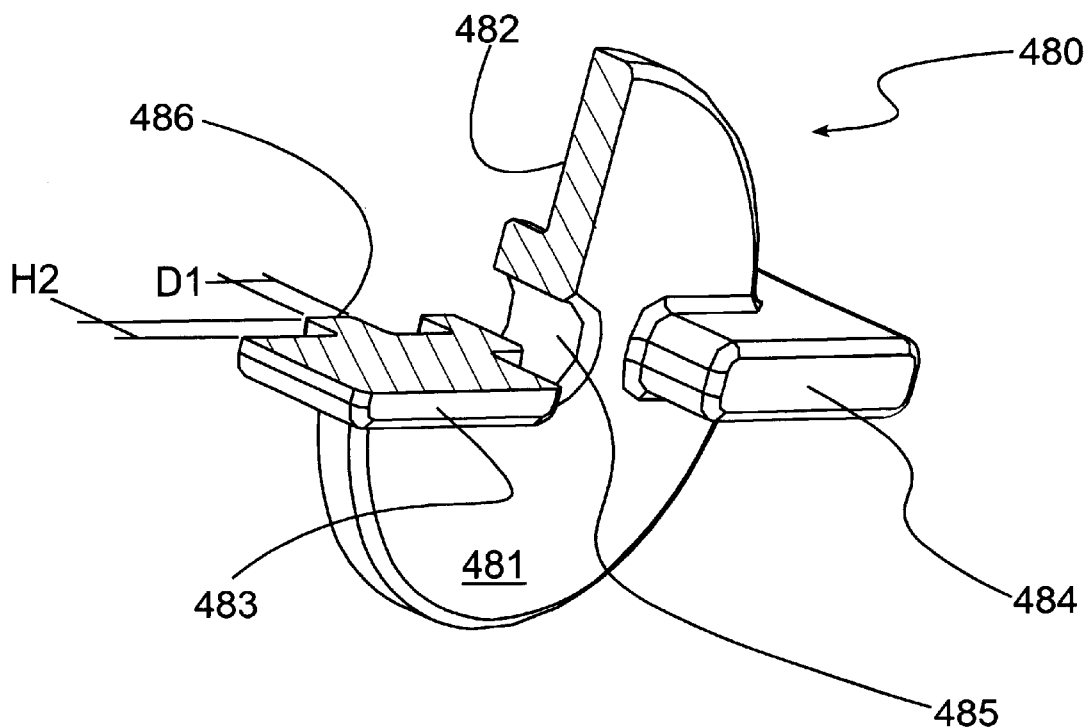
FIG. 12 is a perspective cut-away view of a n ac tuato r of the latch assembly of FIG. 5.

Referring to FIG. 5, the latch assembly 400 may be provided with an actuator 480. Referring now to FIG. 12, the actuator 480 may be provided with a front face portion 481 a back face portion 482, a first tab 483, a second tab 484, an attachment hole 485, a slot protrusion 486 and a detent mechanism hole (not shown). The slot protrusion 486 may have a circular cross-section that may have a diameter of "D1" and a height of "H2". The diameter "D1" of the slot protrusion 486 may be less then the width "W2", FIG. 8, of the capture plate 430. In the exemplary embodiment, the dimensions may, for example, be about 4.56 for "D1" and about 3.05 for "H2". These actual dimensions are considered to be a design alternative and could be scaled to larger or smaller values based on the particular design. The attachment hole 485 may be provided at the center of the front face portion 481 and extend through the actuator 480. The detent mechanism hole may be provided on the back face portion 482 on the second tab 484. The detent mechanism hole may be a blind hole, deep enough to receive the detent spring 488 and detent ball 487. As shown in FIG. 5, a detent ball 487 and a detent spring 488 may be provided in the detent mechanism hole.

Having provided detailed descriptions for the latch assembly 400 components, the assembly steps will now be described. Referring to FIG. 5, the latch assembly 400 may be assembled by aligning the mounting plate front face portion 405, FIG. 7, to the capture plate back face portion 436, FIG. 8. Alignment is correct when the top fastener hole 437 and bottom fastener hole 438 are aligned with the top vertical slot 420 and bottom vertical slot 421 respectively. Referring back to FIG. 5, with the mounting plate 410 and the capture plate 430 aligned, a top front screw 492 and a bottom front screw 494 may be provided to capture the mounting plate 410 and the capture plate 430. The mounting plate 410 and the capture plate 430 may be captured between the top front screw 492 and the top board spacer 450. Additionally, the mounting plate 410 and the capture plate 430 may also be captured between the bottom front screw 494 and the bottom board spacer 451. The dimensions of the board spacers 450, 451 and the mounting plate vertical slots 420, 421, FIG. 7, allow calculated movement to compensate for alignment issues that will be discussed herein.

Referring to FIG. 5, assembly of the latch assembly 400 may be continued by attaching the SCSI board 460 to the top board spacer 450 and the bottom board spacer 451. Attaching the SCSI board 460 may be accomplished by inserting a top back fastener 496 through the top fastener hole 469 and threading it into the top board spacer 450. Additionally, the SCSI board 460 may be attached by inserting a bottom fastener 498 through the bottom fastener hole 470 and threading it into the bottom board spacer 451.

Continuing the assembly of the latch assembly 400 may include installation of the actuator 480. Referring to FIG. 5, the actuator 480 may be attached by threading a mounting fastener 490 into the mounting plate threaded actuator post 414. The mounting fastener 490 may capture the actuator 480 by the actuator attachment hole 485, FIG. 12, thereby securing the actuator 480 to the mounting plate 410. During the installation of the actuator 480, the detent ball 487 and detent spring 488 may be positioned in the detent mechanism hole as previously described. The detent ball 487 may be held into the detent mechanism hole by the mounting plate front face 405, FIG. 7. Referring again to FIG. 5, when installing the actuator 480, the actuator slot protrusion 486 may be inserted into the capture plate horizontal slot 440. The diameter "D1" of the slot protrusion 486, FIG. 12, may be slightly smaller than the width "W2" of the horizontal slot 440, FIG. 8, allowing the slot protrusion 486 to slide in the horizontal slot 440.

Having provided a description of the assembly steps for the latch assembly 400, the attachment of the latch assembly 400 to the drive module 300 will now be described. Prior to attaching the latch assembly 400 to the drive module 300, a ribbon cable 471, FIG. 5, may be connected to the second connector 468. The ribbon cable 471 may also be connected to the drive board connector 325, FIG. 4. As detailed herein, the connection of the ribbon cable 471 electrically connects the first connector 467 to the drive module 300. The connection of the ribbon cable 471 is a one-time connection when installing the latch assembly 400. Further, connection of the ribbon cable 471 typically does not need to be performed by the end-user.

Having described the electrical connection of the latch assembly 400, the physical attachment to the drive module 300 will now be detailed. The mounting plate 410 may be attached to the drive module 300 by a first fastener 416 and a second fastener 418, FIG. 5. The attachment of the mounting plate 410 covers the opening 322, FIG. 4. The first fastener 416 may be inserted through the first attachment hole 412, FIG. 7, and threaded into the left threaded mounting hole 323, FIG. 4, on the back portion 110 of the drive module 300. The second fastener 418 may be inserted through the second attachment hole 413, FIG. 7, and threaded into the right threaded mounting hole 324, FIG. 4, on the back portion 110 of the drive module 300. The orientation of the latch assembly 400 may be such that the fastener cover 439, FIG. 8, faces towards the bottom portion 306, FIG. 4, of the drive module 300.

Having described the assembly and attachment steps of the latch assembly 400 to the drive module 300, the functioning will now be described. A force may be applied to the first and second tabs 483, 484, FIG. 12, causing rotational movement of the actuator 480 about the fastener 490, FIG. 5. The rotational movement results in a clockwise position 500, FIG. 14, and a counterclockwise position 510, FIG. 13. This force may be provided by an end-user turning the actuator 480 by hand. The rotation of actuator 480 causes displacement of the detent ball 487 by compressing the detent spring 488. Displacement of the detent ball 487 allows for definitive registration of the actuator 480. The definitive registration occurs at the limits of movement of the actuator 480 as the detent ball 487 seats into one of the detent holes 411, 415, FIG. 7. The definitive registration causes an audible "click" as to provide sensory feedback to the user.

Figure 13:
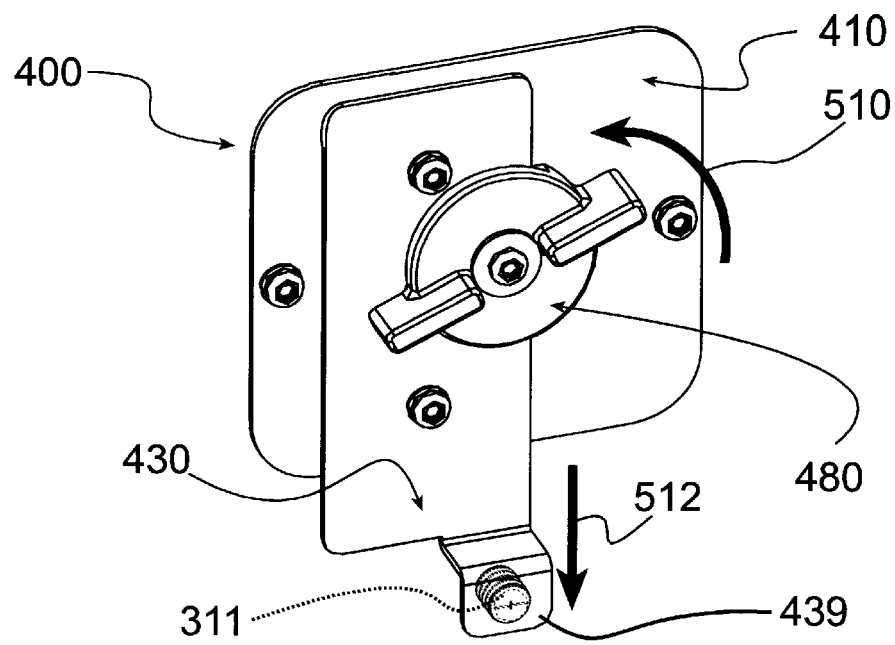
FIG. 13 is a perspective view of the latch assembly of FIG. 5 in a locked and connected condition.
Figure 14:
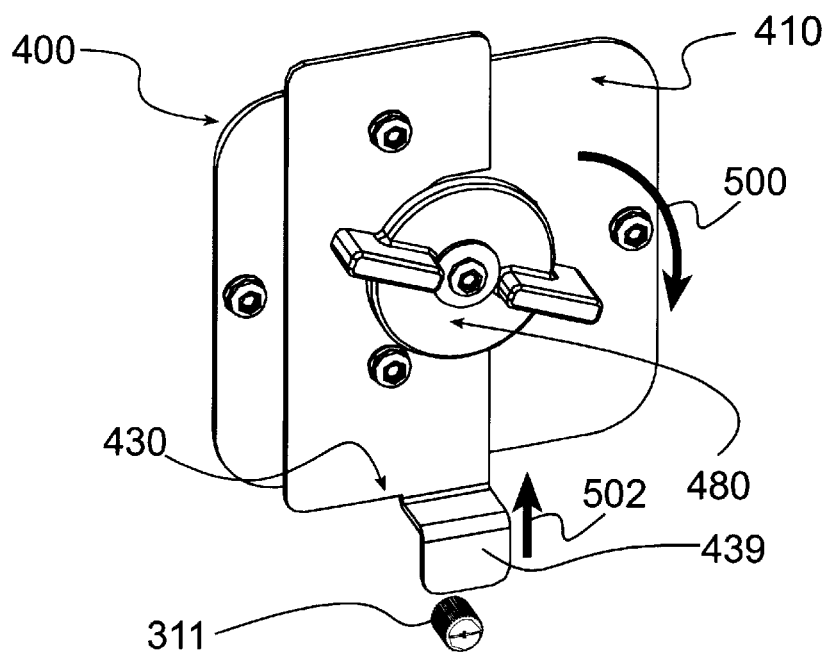
FIG. 14 is a perspective view of the latch of FIG. 5 in an unlocked and disconnected condition.

The rotation of the actuator 480 also causes vertical movement of the capture plate 430. The vertical movement of the capture plate 430 may be caused by the slot protrusion 486, FIG. 12, interacting with the top portion 443, FIG. 8, and bottom portion 444 of the horizontal slot 440. Referring to FIG. 14, turning the actuator 480 in the clockwise direction 500 produces movement of the capture plate 430 in an upward direction 502. Referring to FIG. 13, rotation of the actuator 480 in the counterclockwise direction 510 produces movement of the capture plate 430 in a downward direction 512. 13. The capture plate 430 may be operatively connected to the SCSI board 460. The connection between the SCSI board 460 and the capture plate is provided by the board spacers 450, 451 as previously described. Therefore, the SCSI board 460 may mirror movement of the capture plate 430. The vertical movement of the SCSI board 460 causes the first connector 467, FIG. 11, to connect or disconnect with the SCSI connector 243. When the first connector 467 and the SCSI connector 243 are connected, the drive module 300 is electrically connected to the connectors 210, FIG. 4, of the connector assembly 200.

In the exemplary embodiment, the drive module 300 and the housing 100 may, for example, be manufactured out of sheet metal. Since tolerancing may be an issue with sheet metal, the first connector 467 and the SCSI connector 243 may not be aligned. Therefore, the first connector 467 and the SCSI connector 243 may be designed to be self-aligning. This self-alignment member may be provided by the alignment pins 241, 242 on the SCSI connector 243 and the alignment holes on the bottom end portion 473 of the first connector 467. The dimensions of the top board spacer 450, the bottom board spacer 451, the top vertical slot 420 and the bottom vertical slot 421 allow for the first connector 467 to "float". Since the first connector can "float", the alignment pins 241, 242 guide the first connector 467. As a result of the self-alignment ability of the connectors 243, 467, the effects of the sheet metal manufacturing process may be accommodated.

Having described the movement of the capture plate 430 and the SCSI board 460, the associated operating conditions will now be detailed. The counterclockwise direction 510 and clockwise direction 500 of the actuator 480 dictate the connection and locking conditions. Referring to FIG. 13, with the actuator 480 turned to the counterclockwise direction 510, the drive module 300 may be in a connected and locked condition. The connected condition may occur when the first connector 467, FIG. 11, connects to the SCSI connector 243, FIG. 4. In the connected condition, a communication signal may travel from the connectors 210, through the connector board 220, and through the drive loop cable 230. From the drive loop cable 230, the signal may continue through the housing board 240, through the SCSI connector, and through the first connector 467. From the first connector 467, the signal may travel through the SCSI board 460, through the second connector 468, and through the ribbon cable 471. From the ribbon cable 471, the signal may travel into the drive module 300 through the drive board connector 325. Therefore, the counterclockwise direction 510 of the actuator 480 may result in communication to the drive module 300 though the connectors 210.

Referring still to FIG. 13, the counterclockwise direction 510 of the actuator 480 may also result in a locked condition. The locked condition may occur when the fastener 311 may not be accessed to remove the drive module 300 from the housing 100. When the actuator 480 is in the counterclockwise position, the capture plate 430 is in a downward position. In the downward position, the fastener 311 cannot be turned due to the fastener cover 439. By locking the drive module 300, the user may be prohibited from removing the drive module 300 while it is connected.

Referring to FIG. 14, with the actuator 480 turned in a clockwise direction 500, the drive module 300 may be in a disconnected and unlocked condition. When in the unlocked and disconnected condition, communication to the drive module 300 through the first connector 467 is not possible. Additionally, in the clockwise position, the fastener 311 may be accessed and disengaged from a threaded hole (not shown) allowing for removal of the drive module 300 from the housing 100.

Having described the operating states, the method of installing the drive module 300 will now be described. For illustrative purposes, the drive module 300 is shown in the right side portion 117, FIG. 3, of the bay 115. However, the description will be directed towards installing the drive module 300 into the left side portion 116 of the bay 115.

Prior to installing the drive module 300, the media autochanger system 101 may be notified of the intent to install. The notification may occur through a front panel (not shown), a host computer (not shown) or a network connection (not shown). The front panel, host computer and network connection of the present device are substantially similar as the prior art device as described in the background section.

The drive module 300 may be installed by sliding the drive module 300 into the housing 100 in an installation direction 520, FIG. 3. The installation direction 520 may be substantially perpendicular to the capture plate upward and downward directions 502, 512, FIGS. 13 and 14; the angle between the direction 520 and the directions 502, 512 may, for example, be between about 80 and about 110 degrees. The positioning of the drive module 300 may be directed by the rail system 130, FIG. 4. The left tab 307 and right tab 308 of the rail system 130 may slide on a track (not shown). The track may be located on the cavity 109 side of the top portion 105 of the housing 100. When sliding the drive module 300 in the installation direction 520 into the bay 115, the front portion 302, FIG. 4, progresses towards the front side 102, FIG. 3, of the housing 100. Referring to FIG. 3, near the end of travel of the drive module 300, the fastener 310 may contact the threaded hole 140 on the housing. Additionally, the fastener 311 may contact the threaded hole 141 on the housing 100. Both fasteners 310, 311 may be turned to thread the fasteners 310, 311 into the threaded holes 140, 141, irespectively. The threading of the fasteners 310, 311 may result in securing the drive module 300 to the housing 100.

With the fasteners 310, 311 securing the drive module 300 to the housing 100, the actuator 480 may be utilized. To connect and lock the drive module 300 the actuator 480 may be turned in the counterclockwise direction 510. The counterclockwise position results in the electrical connection of the drive module 300 to the connectors 210 as previously described. Upon successful installation of the drive module 300, the media autochanger system 101 may be notified of the successful installation through the front panel, the host computer or the network connection.

The preceding detailed installation steps allow for locked and connected condition of the drive module 300. To unlock and remove the drive module 300, the installation steps are reversed.

The removal process may begin by notifying the media autochanger system 101 of the intent to remove the drive module 300. The media autochanger system 101 may be notified through the front panel, the host computer or the network connection. Next, to disconnect and unlock the drive module 300, the actuator 480 may be turned in the clockwise direction 500, FIG. 14. The clockwise position results in the electrical disconnection of the drive module 300 from the connectors 210 as previously described. Since the clockwise position of the actuator 480 results in the accessibility of the fastener 311, the fastener 311 may be turned. The fasteners 310, 311 may be unscrewed from the threaded holes 140,141, allowing the drive module 300 to be removed. The drive module 300 may be removed by sliding the drive module 300 out of the housing 100 in a removal direction 524, FIG. 3. The removal direction 524 may be substantially parallel to the installation direction 520. The positioning of the drive module 300 may be directed by the rail system 130 as previously described. When sliding the drive module 300 in the removal direction 524 from the bay 115, the front portion 302, FIG. 4, moves away from the front side 102, FIG. 3, of the housing 100. This removal process results in a drive module 300 that is free from the housing 100.

As can be appreciated, the method and apparatus described herein prevents a user from physically removing the drive module 300 from the housing 100 when the first connector 467, FIG. 11, is electrically connected with the SCSI connector 243, FIG. 4. This, in turn, prevents damage to the connectors 267, 243 which might otherwise occur if a user attempts to remove the drive module 300 while the connectors are engaged. The method and apparatus described herein also provide a relatively quick and convenient way to install and uninstall removable components without the need for tools. Additionally, the user does not need to manually disconnect any wiring in order to remove the drive module 300. Since manual disconnection by the end-user of the wiring is eliminated, the SCSI loop may be maintained to enable communication to "down-line" devices.

The preceding description of the application to a media autochanger system is an example of an application for the device and method. Other applications of this method and apparatus may include, but are not limited to, airplane avionics systems, replaceable control systems on machinery, interchangeable data collection systems, environmental monitoring systems, to name a few.

We claim:

1. A method comprising:
providing at least one first connector operatively associated with a component;
providing at least one second connector operatively associated with a housing;
wherein, said component has a connected condition in which said first connector is electrically engaged with said second connector;
wherein, said component has a disconnected condition in which said first connector is electrically disengaged from said second connector;
wherein, said component has at least a locked condition and an unlocked condition; and
applying a force causing said component to move to said disconnected condition.

2. The method of claim 1 wherein,
in said locked condition, said component cannot be removed from said housing.

3. The method of claim 1 wherein,
said force causes said component to move to said unlocked condition.

4. The method of claim 1 and further comprising:
removing said component from said housing after said component has moved from said locked to said unlocked condition.

5. The method of claim 1, and further comprising:
providing said component with at least one fastener operatively associated therewith;
wherein, in said locked condition, said fastener cannot be actuated; and
wherein, in said unlocked condition, said fastener can be actuated.

6. The method of claim 1 and further comprising:
providing alignment members on said first and said second connectors.

7. The method of claim 1 and further comprising:
providing a member slidably attached to said component wherein said first connector is attached to said member;
wherein, said causing said component to move from said connected condition to said disconnected condition comprises sliding said member relative to said component.

8. The method of clam 1 and further comprising:
providing an actuator operatively associated with said component;
wherein, said force causes said actuator to rotate.

9. The method of claim 3 wherein said fastener is a threaded connector.

10. A system including a housing and a component removably received within said housing, said system comprising:
at least one first connector operatively associated with said component;
at least one second connector operatively associated with said housing;
wherein, said component has at least a connected and a disconnected condition;
wherein, in said connected condition, said first connector is electrically engaged with said second connector;
wherein, in said disconnected condition, said first connector is electrically disengaged from said second connector;
wherein said component has at least a locked condition and an unlocked condition; and
wherein, moving said component from said connected to said disconnected condition causes said component to move from said locked to said unlocked condition.

11. The system of claim 10 wherein, in said locked condition, said component cannot be removed from said housing; and
wherein, in said unlocked condition, said component can be removed from said housing.

12. The system of claim 10 and further comprising:
a rotary actuator operatively connected to said first connector.

13. The system of claim 10 and further comprising:
a capture plate, wherein said first connector is mounted to said capture plate.

14. The system of claim 10 and further comprising:
a fastener, whereby said fastener is operatively accessible when said component is in said unlocked condition.

15. The system of claim 14 wherein, said fastener attaches said component to said housing when said component is in said locked condition.

16. A method comprising:

providing a first electrical connector on a housing;

providing a second electrical connector on a component;

disconnecting said second electrical connector from said first electrical connector by moving said second electrical connector relative to said first electrical connector in a first direction;

moving said component relative to said housing in a second direction; and wherein, said first direction is transverse to said second direction.

17. The method of claim 16 and further comprising:

providing a member slidably mounted on said component; and sliding said member relative to said component.

18. The method of claim 16 and further comprising:

providing at least one fastener releasably securing said component to said housing; and releasing said fastener prior to said moving said component relative to said housing.

19. The method of claim 17 and further comprising:

providing an actuator operatively associated with said component; and actuating said actuator to cause said disconnecting and said sliding said member relative to said component.

20. The method of claim 18 wherein said sliding said member relative to said component allows said releasing said fastener to occur.

* * * * *